(12) United States Patent
Zhao et al.

(10) Patent No.: US 8,587,936 B2
(45) Date of Patent: Nov. 19, 2013

(54) ELECTRONIC DEVICE

(75) Inventors: Ting-Ting Zhao, Shenzhen (CN);
Min-Li Li, Shenzhen (CN); Na Wang,
Shenzhen (CN); He-Li Wang, Shenzhen
(CN)

(73) Assignees: **Hong Fu Jin Precision Industry
(ShenZhen) Co., Ltd.**, Shenzhen (CN);
Hon Hai Precision Industry Co., Ltd.,
New Taipei (TW)

( * ) Notice: Subject to any disclaimer, the term of this patent is extended or adjusted under 35 U.S.C. 154(b) by 395 days.

(21) Appl. No.: 13/106,890

(22) Filed: May 13, 2011

(65) Prior Publication Data

US 2012/0134081 A1 May 31, 2012

(30) Foreign Application Priority Data

Nov. 30, 2010 (CN) .......................... 2010 1 0565821

(51) Int. Cl.
*G06F 1/16* (2006.01)
*H05K 5/00* (2006.01)
*H05K 7/00* (2006.01)

(52) U.S. Cl.
USPC ................................ 361/679.02; 361/679.58

(58) Field of Classification Search
USPC ........................ 361/679.01, 679.02, 679.58
See application file for complete search history.

(56) References Cited

U.S. PATENT DOCUMENTS

| | | | | | |
|---|---|---|---|---|---|
| 4,805,769 | A | * | 2/1989 | Soltis et al. | 206/308.2 |
| 5,265,083 | A | * | 11/1993 | Ishii et al. | 720/605 |
| 5,573,120 | A | * | 11/1996 | Kaufman et al. | 206/755 |
| 5,697,498 | A | * | 12/1997 | Weisburn et al. | 206/308.1 |
| 6,371,300 | B1 | * | 4/2002 | Uchida | 206/751 |
| 6,621,691 | B2 | * | 9/2003 | Howell | 361/679.33 |
| 6,749,507 | B2 | * | 6/2004 | Kutaragi et al. | 463/31 |
| 7,532,464 | B2 | * | 5/2009 | Ligtenberg et al. | 361/727 |
| 8,493,724 | B2 | * | 7/2013 | Zhao et al. | 361/679.27 |
| 2006/0271944 | A1 | * | 11/2006 | Wang et al. | 720/644 |
| 2009/0150914 | A1 | * | 6/2009 | Wang et al. | 720/692 |
| 2011/0310551 | A1 | * | 12/2011 | Wang | 361/679.33 |
| 2012/0181053 | A1 | * | 7/2012 | Zhao et al. | 174/50 |
| 2013/0135807 | A1 | * | 5/2013 | Wang et al. | 361/679.02 |
| 2013/0170821 | A1 | * | 7/2013 | Yu et al. | 386/361 |

* cited by examiner

*Primary Examiner* — Adrian S Wilson
(74) *Attorney, Agent, or Firm* — Altis & Wispro Law Group, Inc.

(57) ABSTRACT

An electronic device includes a main body, a lid, two hinge members, a reinforcing member and a covering structure. The main body has a top surface. The hinge members are disposed at two opposite ends of a side edge of the lid to rotatably connect the lid to the main body. The reinforcing member is disposed on the side edge and located between the two hinge members. The reinforcing member is inserted in the through hole to abut the main body. The covering structure is detachably mounted to the main body and partly covering the through hole.

18 Claims, 7 Drawing Sheets

ELECTRONIC DEVICE

BACKGROUND

1. Technical Field

The present disclosure relates to electronic devices, in particular, to an optical disk player.

2. Description of Related Art

An electronic device, such as an optical disk player, often includes a main body, a lid, and a hinge structure for rotatably connecting the lid to the main body. The hinge structure often includes two hinge members disposed at two opposite ends on a side edge of the lid, which results in the two hinge members being widely spaced apart. Therefore, the side plate may distort after a long-term use.

Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
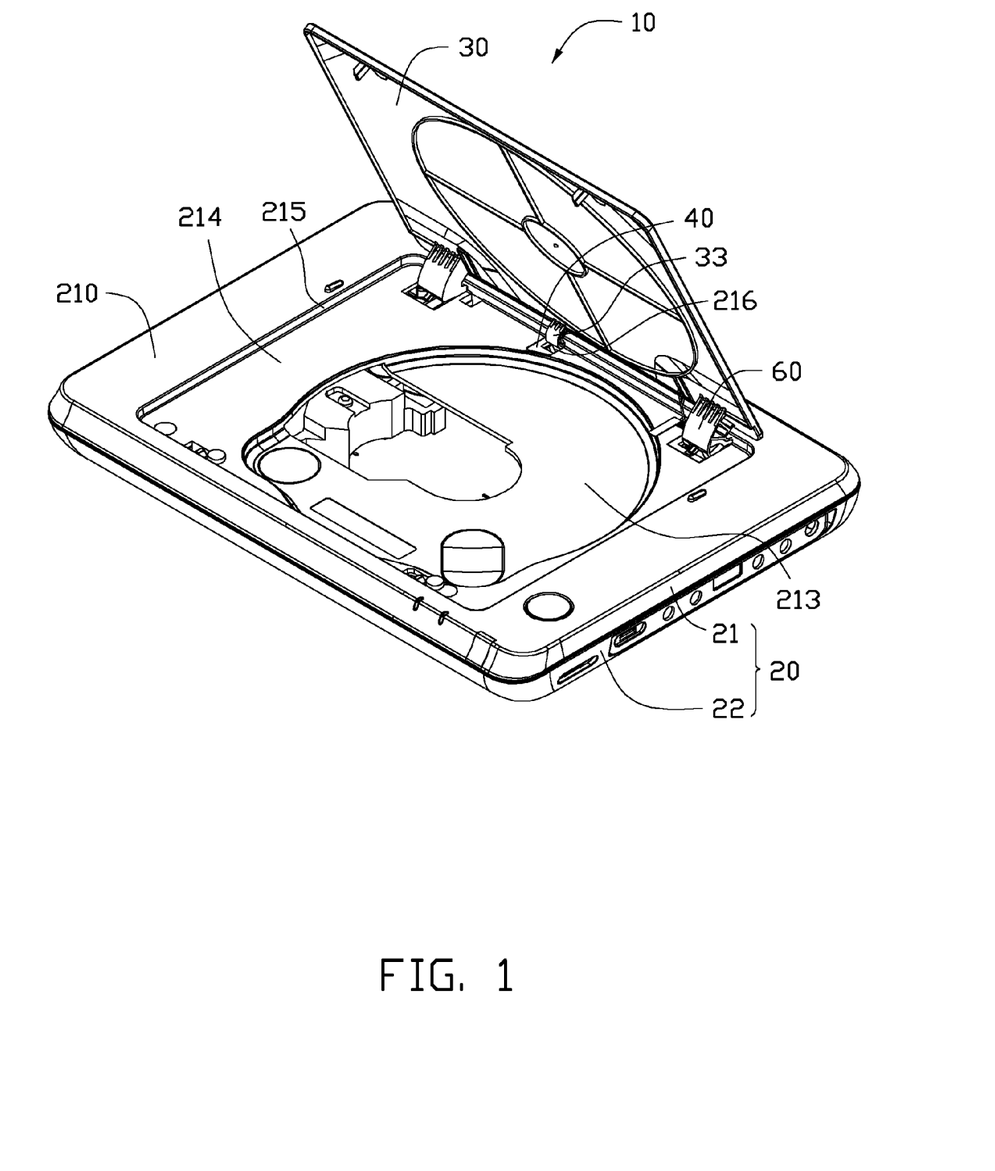
FIG. 1 is a schematic view of an electronic device according to an embodiment of the present disclosure. The electronic device includes a main body defining a through hole, a lid with a reinforcing member disposed thereon, a covering structure, and a securing structure.

Referring to FIG. 1, an electronic device 10 includes a main body 20, a lid 30, a covering structure 40, and two hinge members 60. The lid 30 is rotatably connected to the main body 20 via the hinge members 60. In an embodiment, the electronic device 10 may be an optical disk player, the main body 20 may be configured for carrying various internal and external components used for operating the optical disk player, and the lid 30 is used for covering a disk (not shown) clamped on the main body 20.

Figure 2:
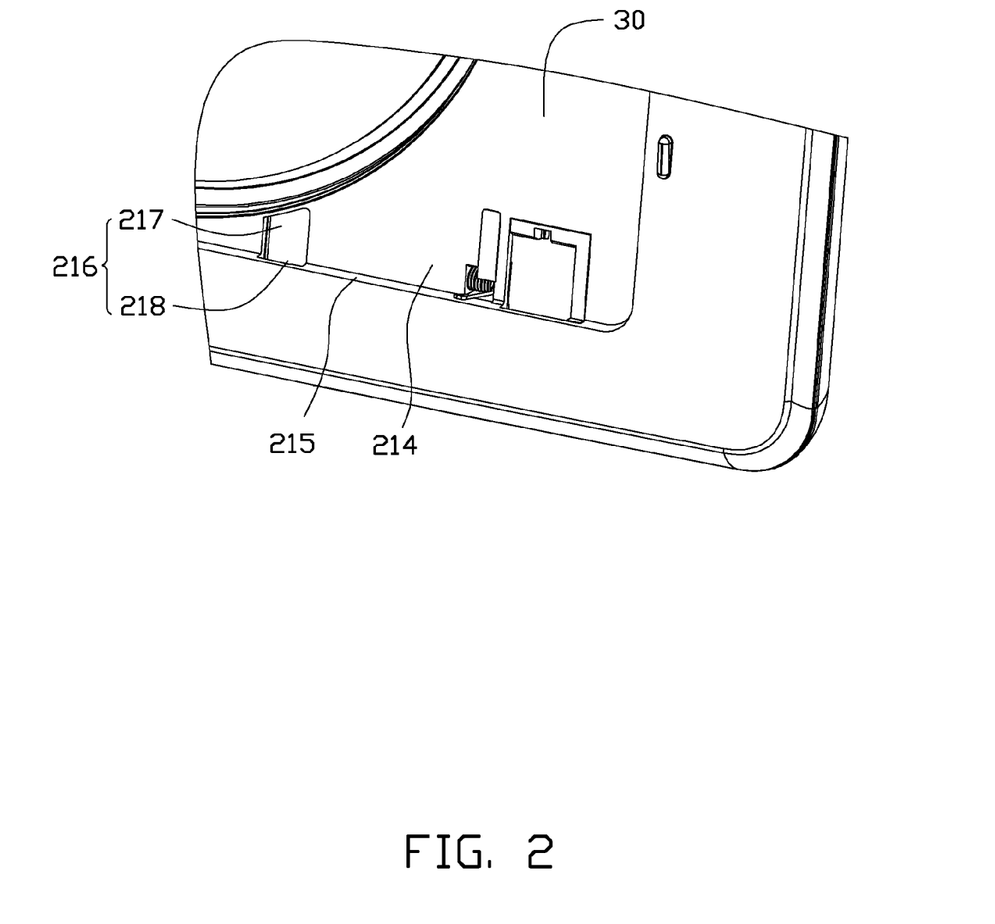
FIG. 2 is a schematic view showing the through hole of FIG. 1.

The main body 20 includes an upper portion 21, and a lower portion 23 engaged with the upper portion 21. The upper portion 21 has a top surface 210 and an interior surface 212 (see FIG. 6) opposite to the top surface 210. The top surface 210 is recessed to define a chamber for accommodating the lid 30. The chamber includes a bottom wall 214 and four side walls 215 extending perpendicularly and upwardly from the bottom wall 214. A depressed portion 213 for accommodating the disk is defined in the bottom wall 214. As shown in FIG. 2, a through hole 216 is defined in the upper portion 21. The through hole 216 includes a first hole portion 217 defined in the bottom wall 214 and a second hole portion 218 defined in one of the side walls 215. The first hole portion 217 communicates with the second hole portion 218. Also, the interior surface 212 of the upper portion 21 is depressed to define a receiving portion 219 adjacent to the through hole 216 (also see FIG. 6).

Figure 3:
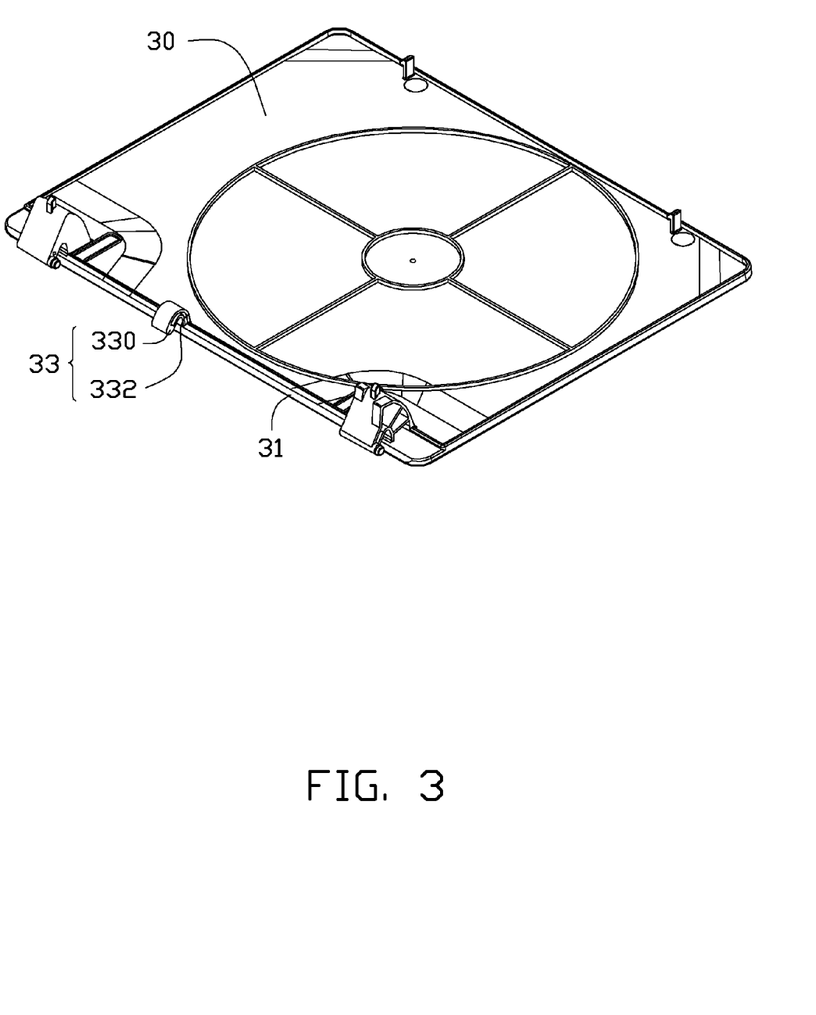
FIG. 3 is a schematic view of the reinforcing member of FIG. 1.

Referring to FIG. 3, the lid 30 includes a side edge 31 and a reinforcing member 33 protruding from the middle of the side edge 31. The reinforcing member 33 is slidably inserted in the through hole 216 and abuts the interior surface 212 to prevent distortion of the side edge 31. In the embodiment, the reinforcing member 33 is hook shaped and includes a first portion 330 and a second portion 332 connecting the first portion 330 to the side edge 31. The second portion 332 extends substantially perpendicularly from the side edge 31, and the first portion 330 extends substantially laterally from an end of the second portion 332. As the reinforcing member 33 is hook shaped, the through hole 216 should be large enough such that the reinforcing member 33 can be easily inserted into the through hole 216 along a direction substantially parallel with the first portion 330. However, when the reinforcing member 33 is inserted in the through hole 216, the through hole 216 may be too large for the reinforcing member 33 to slide within. Therefore, in the embodiment the covering structure 40 (see FIG. 1) may be needed for partly covering the through hole 216.

Figure 4:
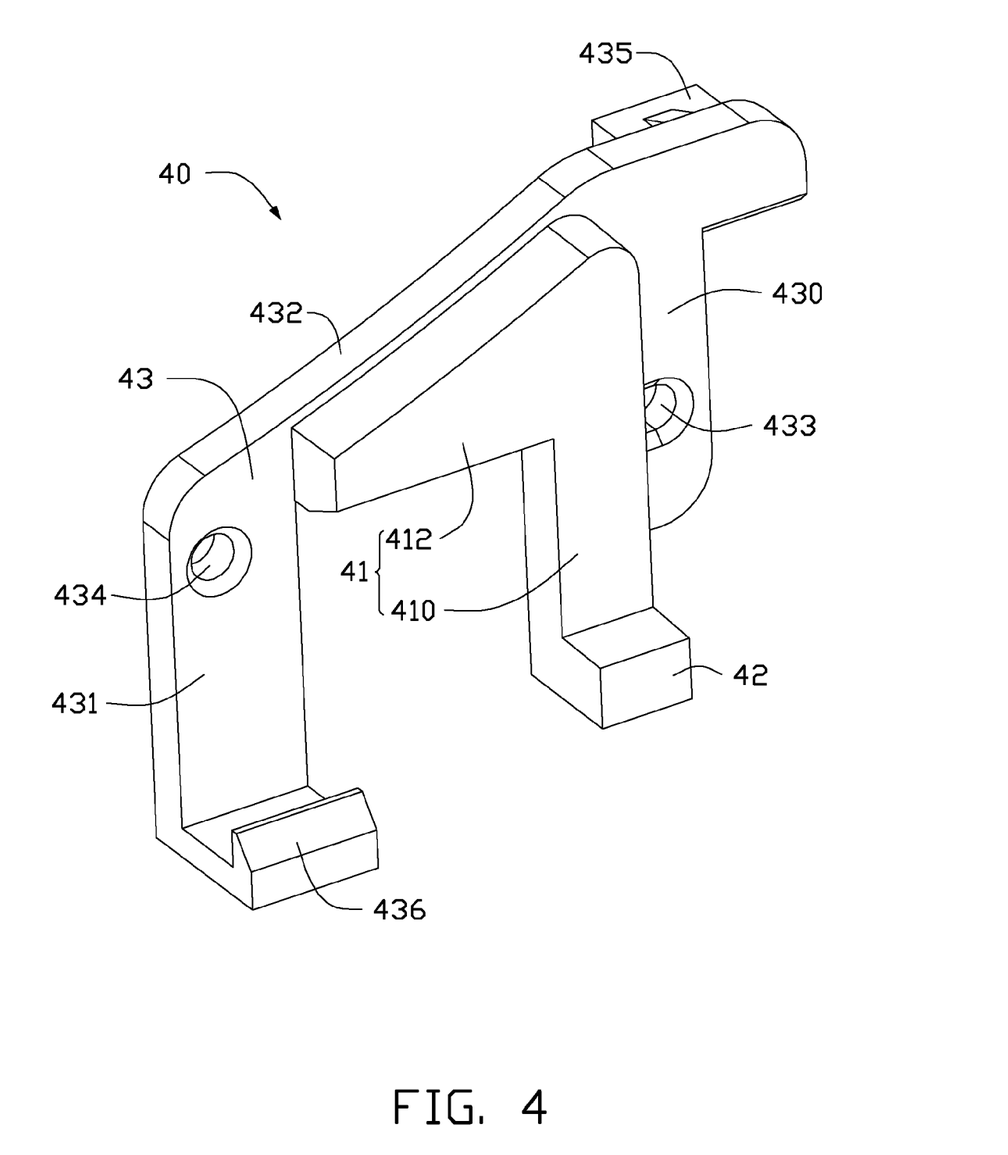
FIG. 4 is schematic view of the covering structure of FIG. 1.
Figure 5:
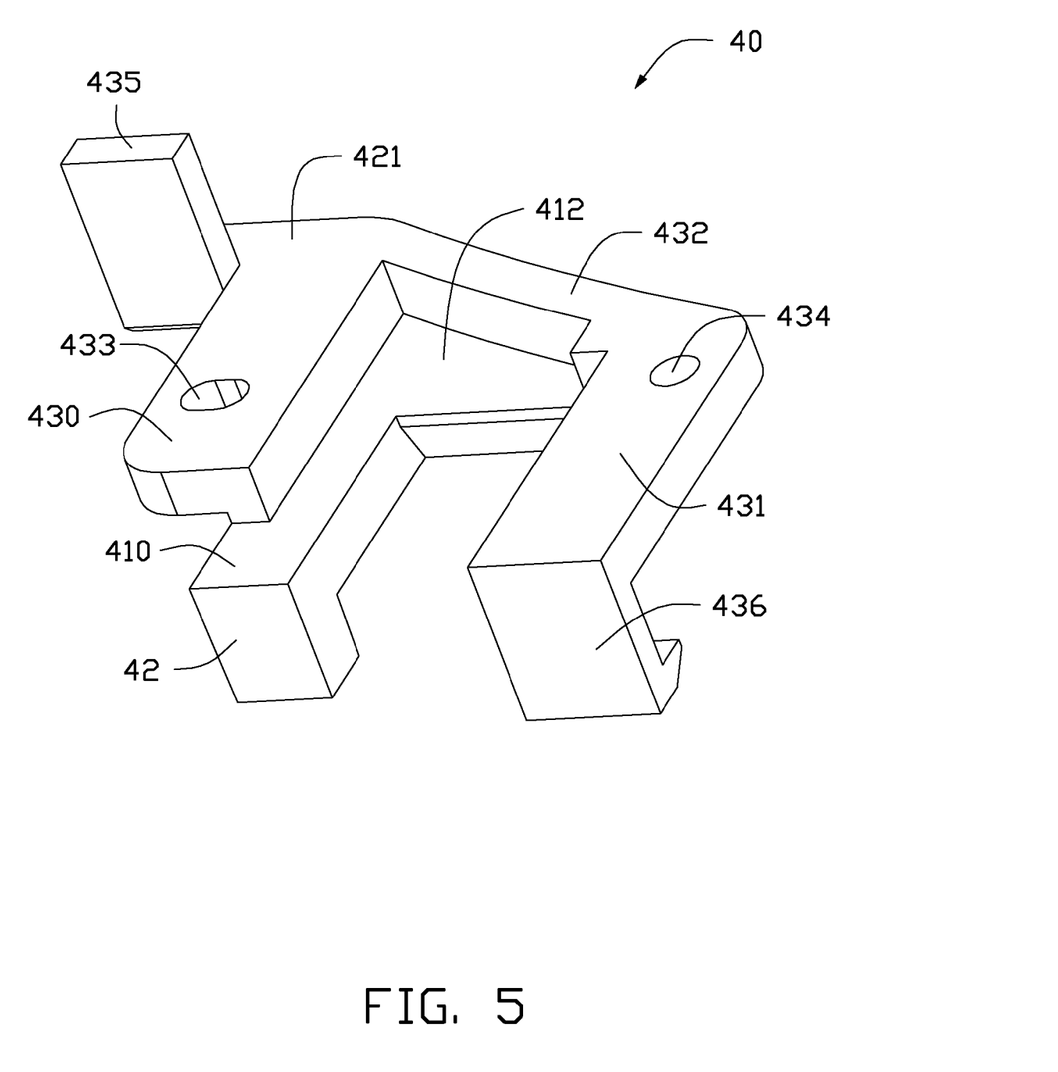
FIG. 5 is similar to FIG. 4 but from another angle.

Referring to FIGS. 4 and 5, the covering structure 40 includes a first covering member 41, a second covering member 42, and a connection member 43 for detachably connecting the first covering member 41 and the second covering member 42 to the upper portion 21. The first covering member 41 protrudes from a side of the connection member 43 and is embedded in the first hole portion 217 (see FIG. 2) for partly covering the first hole portion 217. In the embodiment, the first covering member 41 is substantially L-shaped and includes a first arm 410 and a second arm 412 perpendicularly connected to the first arm 410.

The second covering member 42 protrudes from the first covering member 41 and is embedded in the second hole portion 218 for partly covering the second hole portion 218. The second covering member 42 extends perpendicularly from one end of the second arm 412 along a direction away from the connection member 43.

The connection member 43 is substantially U-shaped, and includes a first connection part 430, a second connection part 431 parallel to the first connection part 430, and a main part 432 connecting the first connection part 430 and the second connection part 431. The main part 432 is connected to the second arm 412 while the first connection part 430 is connected to the first arm 410. A first connection hole 433 is defined in the first connection part 430, and a second connection hole 434 is defined in the second connection part 431.

The connection member 43 further includes an abutting portion 435 and a hook portion 436 respectively connected to the connection parts 430 and 431. The abutting portion 435 protrudes perpendicularly from one side of the first connection part 430 along a direction away from the first covering member 41. The hook portion 436 protrudes from one end of the second connection part 431 in an opposite direction relative to the abutting portion 435.

Figure 6:
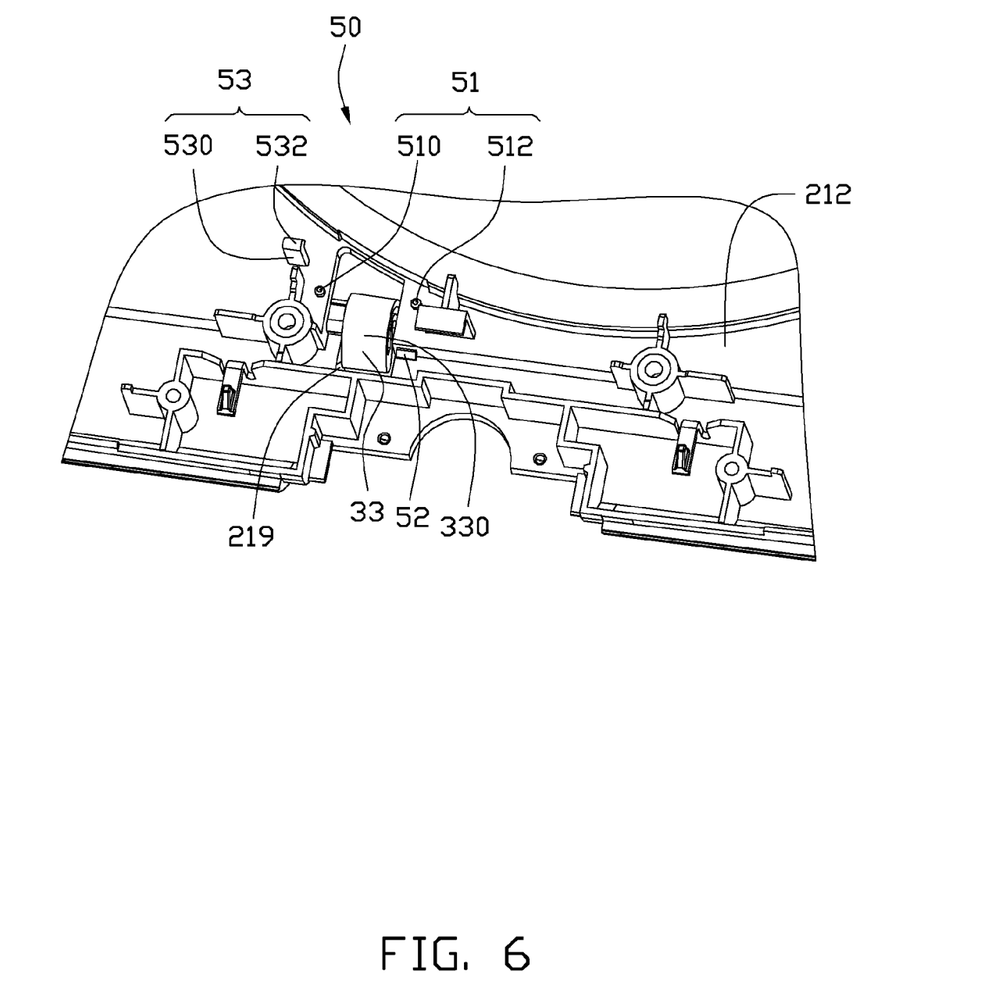
FIG. 6 is a schematic view of the securing structure of FIG. 1.

Referring to FIG. 6, a securing structure 50 is disposed on the interior surface 212 for engaging with the connection member 43 to mount the covering structure 40 to the upper portion 21. The securing structure 50 includes an engaging portion 51, a latching portion 52, and a resisting portion 53. The engaging portion 51 includes a first connection post 510 and a second connection post 512 located at opposite sides of the through hole 216. The two connection posts 510 and 512 are respectively corresponding to the connection holes 433 and 434. The latching portion 52 protrudes from the interior surface of a side wall 214 and adjacent to the second hole portion 218.

The resisting portion 53 is used for engaging with the abutting portion 435. The resisting portion 53 is adjacent to the first connection post 215 and is substantially L-shaped. The resisting portion 53 includes a first resisting part 530 protruding perpendicularly from the interior surface 212 and a second abutting part 532 extending perpendicularly from one end of the first resisting part 530 which is away from the interior surface 212.

When the lid 30 is mounted to the upper portion 21 by the hinge members 60, the reinforcing member 33 is inserted into the through hole 216, with the first portion 330 abutting the interior surface 212 and received in the receiving portion 219.

Figure 7:
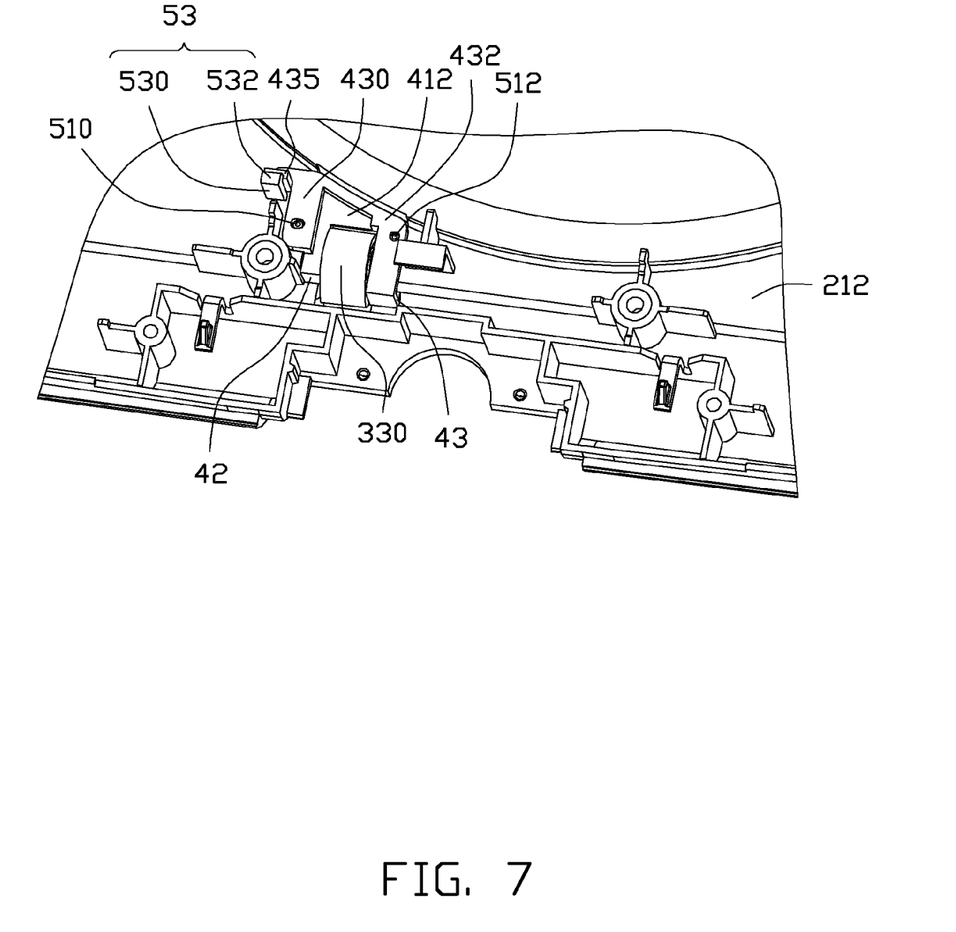
FIG. 7 is a schematic view showing the engagement between the covering structure and the securing structure of FIG. 1.

Referring also to FIG. 7, when the covering structure 40 is mounted to the upper portion 21, the connection posts 510 and 512 are respectively inserted in the connection holes 433 and 434, the covering structure 40 thus is prevented from moving away from the upper portion 21 along directions parallel with the bottom wall 214. The hook 436 is clipped on a side of the latching portion 52, thereby preventing the protective structure 40 from moving away from the upper portion 21 along a direction substantially perpendicular to the bottom wall 215. The abutting portion 435 engages with the resisting portion 53 to further restrict the covering structure 40 from moving perpendicularly from the upper portion 21. The first covering member 41 is received in the first hole portion 217, and the second covering member 42 is received in the second hole portion 218.

In use, as the lid 30 is rotated relative to the main body 20, the reinforcing member 33 slides in the through hole 216 with the first portion 330 abutting the interior surface 212.

It is to be understood, however, that even though information and advantages of the present embodiments have been set forth in the foregoing description, together with details of the structures and functions of the present embodiments, the disclosure is illustrative only; and that changes may be made in detail, especially in matters of shape, size, and arrangement of parts within the principles of the present embodiments to the full extent indicated by the broad general meaning of the terms in which the appended claims are expressed.

What is claimed is:

1. An electronic device, comprising:
a main body defining a through hole;
a lid pivotably connected to the main body via two hinge members disposed at two opposite ends of a side edge of the lid respectively;
a reinforcing member disposed on the side edge and located between the two hinge members, wherein the reinforcing member is slidably inserted in the through hole and abuts against the interior surface of the main body to prevent distortion of the side edge; and
a covering structure detachably mounted to the main body and partly covering the through hole.

2. The electronic device as claimed in claim 1, wherein the through hole comprises a first hole portion and a second hole portion communicating with the first hole portion, the covering structure comprises a first covering member partly covering the first hole portion and a second covering member for partly covering the second hole portion.

3. The electronic device as claimed in claim 2, wherein the main body comprises a top surface, the top surface is depressed to define a chamber in the main body for accommodating the lid, the chamber comprises a bottom wall and a side wall extending from the bottom wall, the first hole portion and the second hole portions are defined in the bottom wall and the side wall respectively.

4. The electronic device as claimed in claim 1, wherein the covering structure further comprises a connection member, the main body comprises a securing structure engaging with the connection member for connecting the covering structure to the main body.

5. The electronic device as claimed in claim 4, wherein the connection member defines two connection holes, the securing structure comprises two connection posts inserted within the two connection holes respectively for restricting the covering structure from moving along a first direction substantially parallel with the interior surface.

6. The electronic device as claimed in claim 5, wherein the connection member comprises an abutting portion, the securing structure comprises a resisting portion protruding from the interior surface of the main body to engage with the abutting portion for preventing the covering structure from moving along a second direction substantially perpendicular to the interior surface.

7. The electronic device as claimed in claim 6, wherein the resisting portion comprises a first resisting part protruding from the interior surface of the main body and a second resisting part connected to one end of the first resisting part which is away from the interior surface.

8. The electronic device as claimed in claim 5, wherein the connection member further comprises a hook portion, the securing structure comprises a latching portion spaced apart from the interior surface of the main body, the hook portion hooks on the latching portion for preventing the covering structure from moving along a second direction substantially perpendicular to the interior surface.

9. The electronic device as claimed in claim 1, wherein the reinforcing member is hook shaped with one end connected to the side edge and one end abutting the interior surface of the main body.

10. The electronic device as claimed in claim 9, wherein the interior surface is depressed to define a receiving portion adjacent to the through hole for receiving the end of the reinforcing member.

11. An electronic device, comprising:
a main body defining a through hole;
a rotatable portion connected to the main body with a reinforcing member disposed thereon, the reinforcing member passing through the through hole to abut the main body for avoiding distortion of the side edge;
two connection structures disposed at two opposite ends of a side edge of the rotatable portion with the reinforcing member disposed therebetween for connecting the rotatable portion to the main body; and
a covering member received in the through hole for partly covering the through hole.

12. The electronic device as claimed in claim 11, wherein the electronic device further comprises a connection member connected to the covering member for engaging with the main body to detachably connect the covering member to the main body.

13. The electronic device as claimed in claim 12, wherein the connection member comprises two connection parts defining two connection holes, the main body comprises two connection posts protruding from an interior surface thereof for respectively passing through the connection holes to prevent the covering member from moving along a first direction substantially parallel with the interior surface.

14. The electronic device as claimed in claim 13, wherein the connection member comprises an abutting portion protruding from the connection parts, the main body comprises a resisting portion protruding from the interior surface to engage with the abutting portion for preventing the covering member from moving along a second direction substantially perpendicular to the interior surface.

15. The electronic device as claimed in claim 14, wherein the resisting portion comprises a first resisting part protruding from the interior surface of the main body and a second resisting part perpendicularly connected to one end of the first resisting part which is away from the interior surface.

16. The electronic device as claimed in claim 13, wherein the connection member comprises a hook portion connected to the connection parts, the main body comprises a latching portion, the hook portion hooks on the latching portion for preventing the covering member from moving away from the main body along the second direction.

17. The electronic device as claimed in claim 16, wherein the main body defines a top surface, the top surface is depressed to form a bottom wall and a side wall extending from the bottom wall; the through hole comprises a first hole portion defined in the bottom wall and a second hole portion defined in the side wall communicating with the first hole portion.

18. The electronic device as claimed in claim 17, wherein the covering member defines a first covering member for partly covering the first hole portion and a second covering member connected to the first covering member for partly covering the second hole portion.

* * * * *